United States Patent
Gomez

(10) Patent No.: US 6,798,304 B2
(45) Date of Patent: Sep. 28, 2004

(54) APPARATUS AND METHOD FOR REDUCING PHASE NOISE IN OSCILLATOR CIRCUITS

(75) Inventor: Ramon A. Gomez, San Juan Capistrano, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 10/692,001

(22) Filed: Oct. 24, 2003

(65) Prior Publication Data

US 2004/0090280 A1 May 13, 2004

Related U.S. Application Data

(63) Continuation of application No. 10/199,113, filed on Jul. 22, 2002, now Pat. No. 6,639,478, which is a continuation of application No. 09/783,033, filed on Feb. 15, 2001, now Pat. No. 6,437,652.
(60) Provisional application No. 60/258,492, filed on Dec. 29, 2000.

(51) Int. Cl.[7] .................... H03B 5/00; H03B 5/08; H03B 5/32
(52) U.S. Cl. .................. 331/116 FE; 331/105; 331/116 R; 331/117 R; 331/158; 331/175
(58) Field of Search .............. 331/78, 105, 116 R, 331/116 FE, 117 R, 117 FE, 117 D, 158, 167, 175, 181, 185

(56) References Cited

U.S. PATENT DOCUMENTS

| | | | |
|---|---|---|---|
| 3,824,491 A | 7/1974 | Treadway | 331/109 |
| 4,743,865 A | 5/1988 | Chauvin | 331/116 R |
| 4,797,639 A | 1/1989 | Driscoll | 331/158 |
| 5,030,926 A | 7/1991 | Walden | |
| 5,053,773 A | 10/1991 | Mosinski | 342/26 |
| 5,063,358 A | 11/1991 | Vale et al. | 331/60 |
| 5,138,285 A | 8/1992 | Michels | 331/116 |
| 5,379,457 A | 1/1995 | Nguyen | 455/323 |
| 5,422,605 A | 6/1995 | Yang et al. | 331/116 R |
| 5,450,042 A | 9/1995 | Good et al. | |
| 6,437,652 B1 | 8/2002 | Gomez | |
| 6,639,478 B2 * | 10/2003 | Gomez | 331/116 FE |

FOREIGN PATENT DOCUMENTS

WO   WO 97/09786   3/1997   ............ H03L/7/08

OTHER PUBLICATIONS

U.S. patent application Ser. No. 09/438,689, Ward et al., filed Nov. 12, 1999.
Copy of International Search Report for Appln. No. EP 01310907.9 issued Feb. 6, 2003, 3 pages.

* cited by examiner

Primary Examiner—David Mis
(74) Attorney, Agent, or Firm—Sterne, Kessler, Goldstein & Fox P.L.L.C.

(57) ABSTRACT

A resonant oscillator circuit includes an active device and a resonator that causes the active device to oscillate at a resonant frequency of the resonator. The active device includes one or more transistors that are DC biased using one or more resistors. The bias resistors generate thermal noise that is proportional to the resistance value. An external inductor circuit is connected across the output terminals of the active device and in parallel with the resonator. The external inductor circuit shorts-out at least some of the thermal noise that is generated by the bias resistors, and thereby reduces the overall phase noise of the resonant oscillator.

21 Claims, 14 Drawing Sheets

APPARATUS AND METHOD FOR REDUCING PHASE NOISE IN OSCILLATOR CIRCUITS

CROSS-REFERENCE TO RELATED APPLICATIONS

This application is a continuation of U.S. application Ser. No. 10/199,113 filed Jul. 22, 2002, now U.S. Pat. No. 6,639,478, which is a continuation of U.S. Applicaton Ser. No. 09/783,033, filed on Feb. 15, 2001, now U.S. Pat. No. 6,437,652, which claims the benefit of U.S. Provisional Application No. 60/258,492, filed on Dec. 29, 2000, all of which are incorporated herein by reference in their entirety.

BACKGROUND OF THE INVENTION

1. Field of the Invention

The present invention generally relates to phase noise reduction in oscillator circuits, and more specifically to phase noise reduction in differential crystal oscillator circuits.

2. Background Art

Radio frequency (RF) transmitters and receivers perform frequency translation by mixing an input signal with a local oscillator (LO) signal. Preferably, the LO signal should have a frequency spectrum that is as close to a pure tone as possible in order to maximize system performance during the signal mixing operation. The deviation of the LO signal from a pure tone is quantified as phase noise or phase jitter, and is generally referred to as spectral purity. In other words, a LO signal with good spectral purity has low phase noise.

Typically, the LO signal is generated from a lower frequency reference signal in order to maximize spectral purity. The lower frequency reference signal is often frequency multiplied to generate the higher frequency LO signal. For instance, a phase lock loop (PLL) generates an output signal that is a frequency multiple of an input reference signal, but is phase-locked to the input reference signal. In some applications, several multiplication stages are required to achieve the desired LO frequency.

Frequency multiplication can negatively impact spectral purity by increasing phase noise in the output LO signal. Phase noise increases because frequency multiplication (which is equivalently phase multiplication) enhances phase noise spectral density as the square of the multiplication factor. Therefore, the higher order multiplication of a noisy reference signal is to be avoided.

A crystal oscillator is often used to generate the reference signal because of its inherently low phase noise attributes. A crystal oscillator includes an active device and a crystal, where the impedance of the crystal is a short (or an open) circuit at a natural resonant frequency. By connecting the crystal in parallel with the active device, a positive feedback path is created between the oscillator terminals at the crystal resonant frequency. The positive feedback causes the active device to oscillate at the crystal resonant frequency.

A crystal resonator has a relatively high quality factor, or "Q", when compared to other types of resonators. Therefore, the bandwidth of the crystal resonance is relatively narrow so that the impedance change of the crystal in the vicinity of its resonant frequency is relatively abrupt. The relatively high Q of the crystal improves the spectral purity of a crystal oscillator output signal because the crystal resonance determines the frequency of oscillation for the active device in the oscillator. Accordingly, a crystal oscillator has a relatively low phase noise compared to other resonant oscillator configurations.

The active device in the crystal oscillator typically includes one or more transistors that can be configured in various arrangements. Transistors necessarily require some type of bias circuitry to power the transistors. The bias circuitry typically includes one or more resistors, which inherently produce thermal noise that is proportional to the total resistance. The thermal noise voltage modulates the zero crossings of the oscillation waveform, and increases the phase noise floor around the oscillation frequency. The increased phase noise floor detracts from the inherently low phase noise of a crystal oscillator. Additionally, as stated above, a high phase noise floor is undesirable in reference signals that drive frequency synthesizers because the output phase noise increases with square of any frequency multiplication that is performed by the synthesizer.

Therefore, what is needed is an oscillator circuit architecture that nullifies the thermal noise voltage that is created by the bias resistors that power the active device in the oscillator circuit.

BRIEF SUMMARY OF THE INVENTION

The present invention is directed to an external inductor circuit that reduces phase noise in a resonant oscillator circuit. The external inductor circuit provides a DC path across the oscillator output terminals and shorts-out thermal noise that is generated by the oscillator circuit, thereby preventing the thermal noise from increasing the phase noise floor of the oscillator output signal.

A resonant oscillator circuit includes an active device and a resonator, such as a crystal resonator. The resonator causes the active device to oscillate at the resonant frequency $f_0$ of the resonator by creating positive feedback (or negative resistance) in the active device at the resonant frequency $f_0$.

The active device includes one more transistors that require DC bias circuitry to provide power for the transistors. The DC bias circuitry typically includes one or more resistors that generate thermal noise that increases in proportion to the total resistance. The external inductor circuit is connected across the terminals of the oscillator circuit, and in parallel with the resonator. The external inductor circuit shorts-out the thermal noise from the resistors so the thermal noise does not increase the phase noise floor of the oscillator output signal.

The external inductor circuit includes an inductor and a resistor connected in series, which provide the DC path that shorts-out the thermal noise from the bias resistors. The value of the inductor is sufficiently large so as not to interfere with the positive feedback path that is created by the resonator at the resonant frequency $f_0$. In other words, the parallel combination of the inductor and the resonator should not substantially shift the resonant frequency $f_0$ of the resonator, so as not to change the operating frequency of the oscillator. This can be accomplished by assuring that any parasitic resonance caused by the external inductor is sufficiently lower in frequency than the intended resonant frequency of the resonator.

The value of the resistor is sufficiently large to suppress any unwanted parasitic oscillations that are caused by the external inductor resonating with the resonator capacitance. However, the resistor in the external inductor circuit should be no larger than necessary as it will generate its own thermal noise that is proportional to the resistor value just like the bias resistors for the active device. In embodiments, the resistor value is no larger than the bias resistors associated with the active device.

Further features and advantages of the present invention, as well as the structure and operation of various embodiments of the present invention, are described in detail below with reference to the accompanying drawings.

BRIEF DESCRIPTION OF THE DRAWINGS/FIGURES

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

1. Oscillator Configuration

Figure 1A:
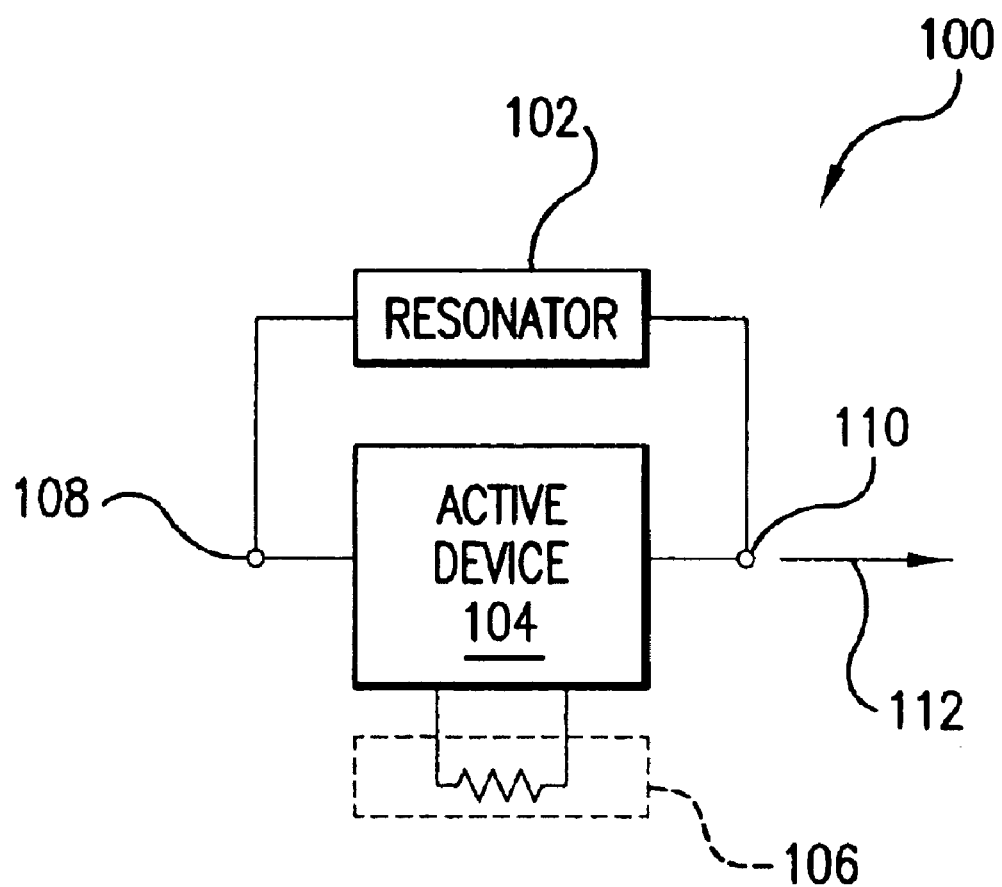
FIG. 1A illustrates an oscillator configuration.
Figure 1B:
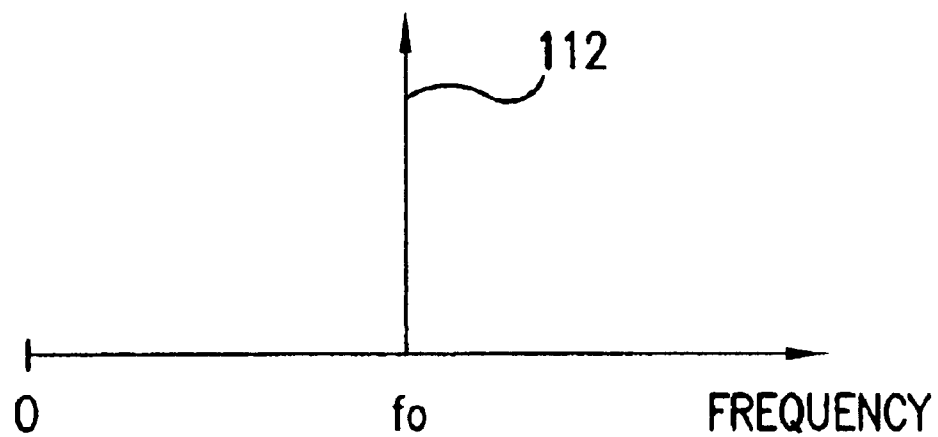
FIG. 1B illustrates an ideal oscillator output signal that does not include phase noise.

FIG. 1A illustrates an oscillator circuit 100 having a resonator 102, an active device 104, and at least one resistor 106 to bias the active device 104. The oscillator 100 generates the output signal 112 that is preferably a pure tone in the frequency domain at the resonant frequency $f_0$ of the resonator 102, as shown in FIG. 1B.

Figure 1C:
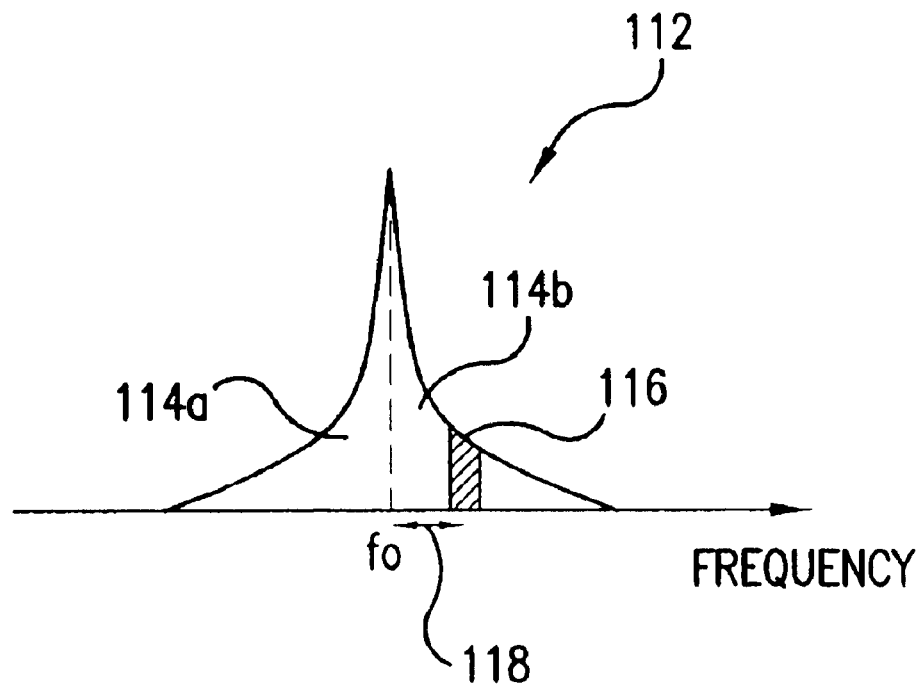
FIG. 1C illustrates an oscillator output signal that does include phase noise.

Realistically, the output signal 112 is not a pure tone because of the phase noise that is associated with the oscillator circuit 100. As shown in FIG. 1C, the phase noise manifests itself as energy "skirts" 114 around the oscillation frequency $f_0$. To quantify phase noise, the noise power in a unit frequency bandwidth 116 is determined at an offset 118 from the resonant frequency $f_0$. The measured noise power in bandwidth 116 is then divided by the average total power in the output signal 112 to calculate a value for the phase noise.

The active device 104 is capable of oscillating when there is positive feedback (or a negative resistance) between an input terminal 108 and an output terminal 110. For instance, the active device 104 can include one or more transistors that have sufficient gain at the frequency of interest to oscillate. Exemplary transistors include a field effect transistor (FET) and a bipolar junction transistor (BJT). In embodiments, the active device 104 is configured to include a cross-coupled differential pair of transistors, which is described further herein.

Figure 2A:
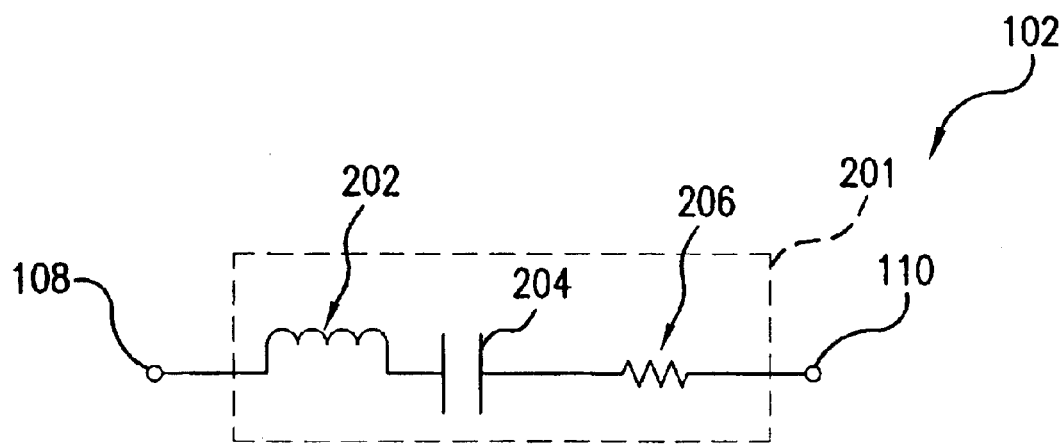
FIG. 2A illustrates a series resonant circuit.

The resonator 102 is connected across the terminal 108 and the terminal 110 of the active device 104, and has an impedance that approaches a short circuit or an open circuit at the resonant frequency $f_0$. For example and without limitation, the resonator 102 can be a series LC circuit 201 (FIG. 2A), a parallel LC circuit 207 (FIG. 2B), or a crystal 214 (FIG. 2C), all of which are described in further detail below. At the resonant frequency $f_0$, the resonator 102 causes the positive feedback that is required for the active device 104 to oscillate and produce the output signal 112.

Figure 3A:
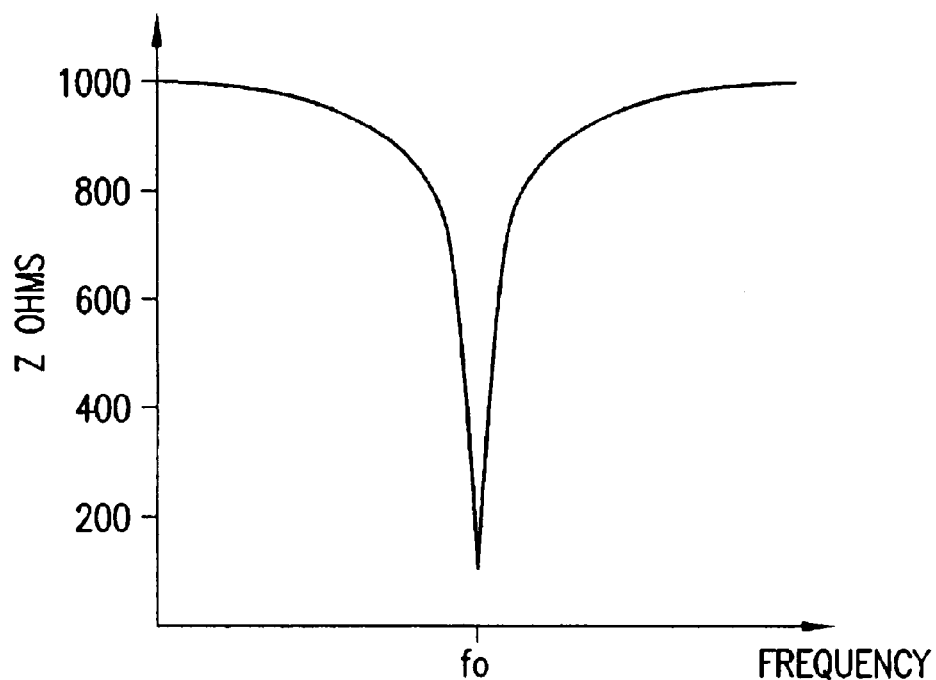
FIG. 3A illustrates an impedance plot for a series resonant device.

The series LC circuit 201 has an inductor 202, a capacitor 204, and a parasitic resistor 206 that are connected in series. The impedance of the LC circuit 201 is depicted in FIG. 3A. As shown in FIG. 3A, the impedance of the LC circuit 201 approaches 0 ohms at the resonant frequency $f_0$, as this is the frequency where the impedance of the inductor 202 and the capacitor 204 cancel each other. The resonant frequency $f_0$ is determined according to the following equation:

$$f_0 = (1/2\pi) \cdot 1/sqrt(LC) \qquad \text{Eq. 1}$$

Ideally, the resistance of the parasitic resistor 206 is 0 ohms, in which case the impedance of the LC circuit 201 would be 0 ohms at the resonant frequency $f_0$. Practically, the resistance of the parasitic resistor 206 is non-zero, and therefore the resistance of the LC circuit 201 at $f_0$ is not 0 ohms. The quality factor (or "Q") quantifies bandwidth (or "sharpness") of the resonance based on the ratio of the circuit reactance and the parasitic resistance according the equation:

$$Q = (2\pi f_0 L)/R \qquad \text{Eq. 2}$$

As shown by Eq. 2, Q increases for the series LC circuit 201 as the resistance R decreases. Correspondingly, the oscillator Q and spectral purity also increases as the resistance R decreases.

Figure 2B:
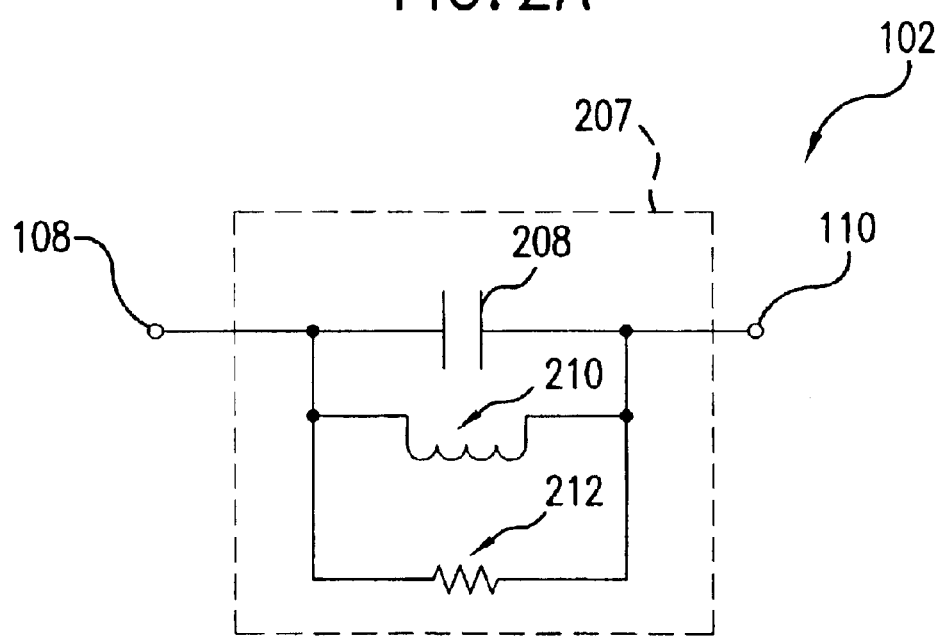
FIG. 2B illustrates a parallel resonant circuit.
Figure 2C:
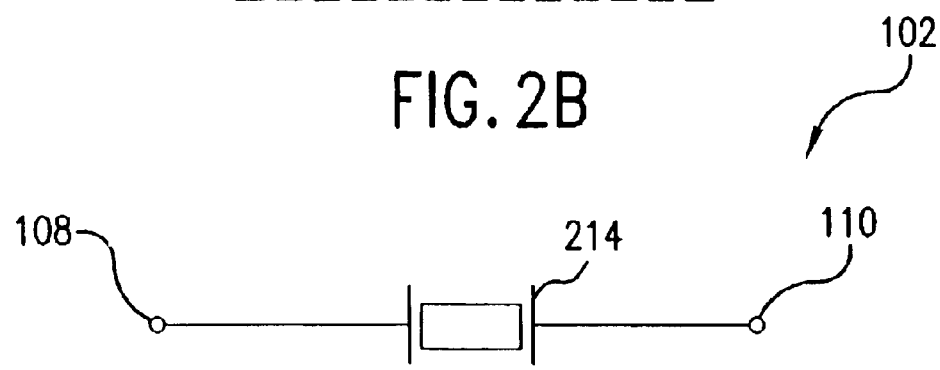
FIG. 2C illustrates a crystal resonator.
Figure 3B:
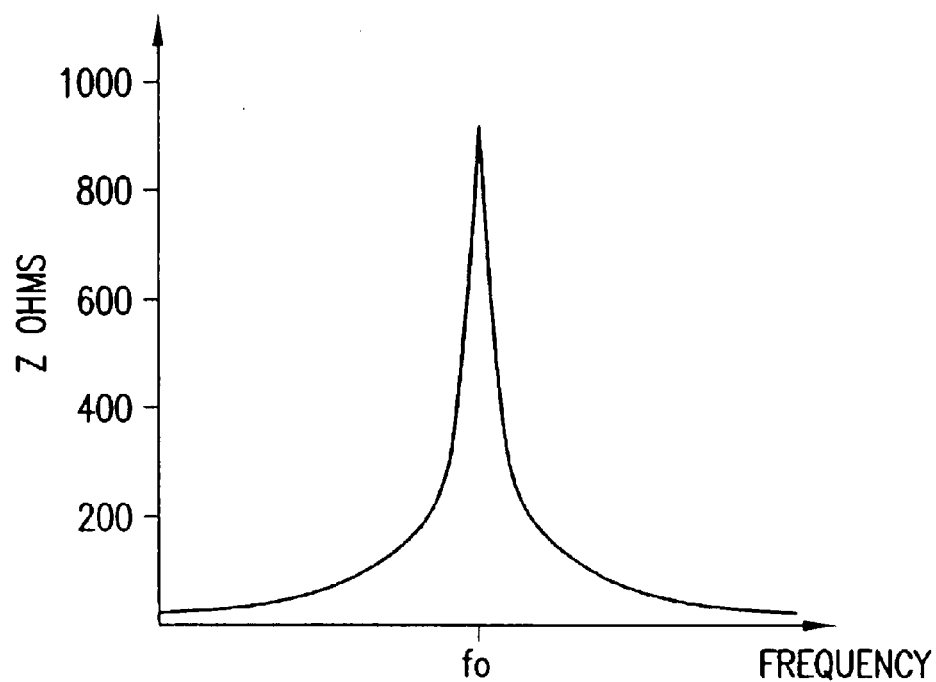
FIG. 3B illustrates an impedance plot for a parallel resonance device.

Referring to FIG. 2B, the parallel LC circuit 207 has a capacitor 208, an inductor 210, and a resistor 212 that are connected in parallel. The impedance of the LC circuit 207 is depicted in FIG. 3B. As shown in FIG. 3B, the impedance of the LC circuit 207 approaches an open circuit at the resonant frequency $f_0$, as this is the frequency where the admittance of the inductor 210 and the capacitor 208 cancel each other out. Ideally, the parasitic resistor 212 is infinite (i.e. an open circuit), in which case the impedance of the LC circuit 207 would be an ideal open circuit at the resonant frequency $f_0$. Practically, the parasitic resistor 212 is a not infinite, and therefore the impedance of the LC circuit 207 at $f_0$ is not infinite. Q for a parallel LC circuit is determined according to the following equation:

$$Q = 2\pi f_0 RC \qquad \text{Eq. 3}$$

As shown by Eq. 3, Q increases for the parallel LC circuit 201 as the resistance R increases. Correspondingly, the oscillator Q and spectral purity also increases as the resistance R increases.

The crystal 214 has a reciprocal relationship (called the piezoelectric effect) between the mechanical deformation along one crystal axis and the appearance of an electrical potential along a second crystal axis. Therefore, deforming a crystal will separate charges and produce a voltage at the crystal terminals. Conversely, an applied voltage across the crystal will deform the crystal. If the applied voltage is sinusoidal with a variable frequency, then the crystal will go into mechanical oscillation, and exhibit a number of resonant frequencies.

Figure 2D:
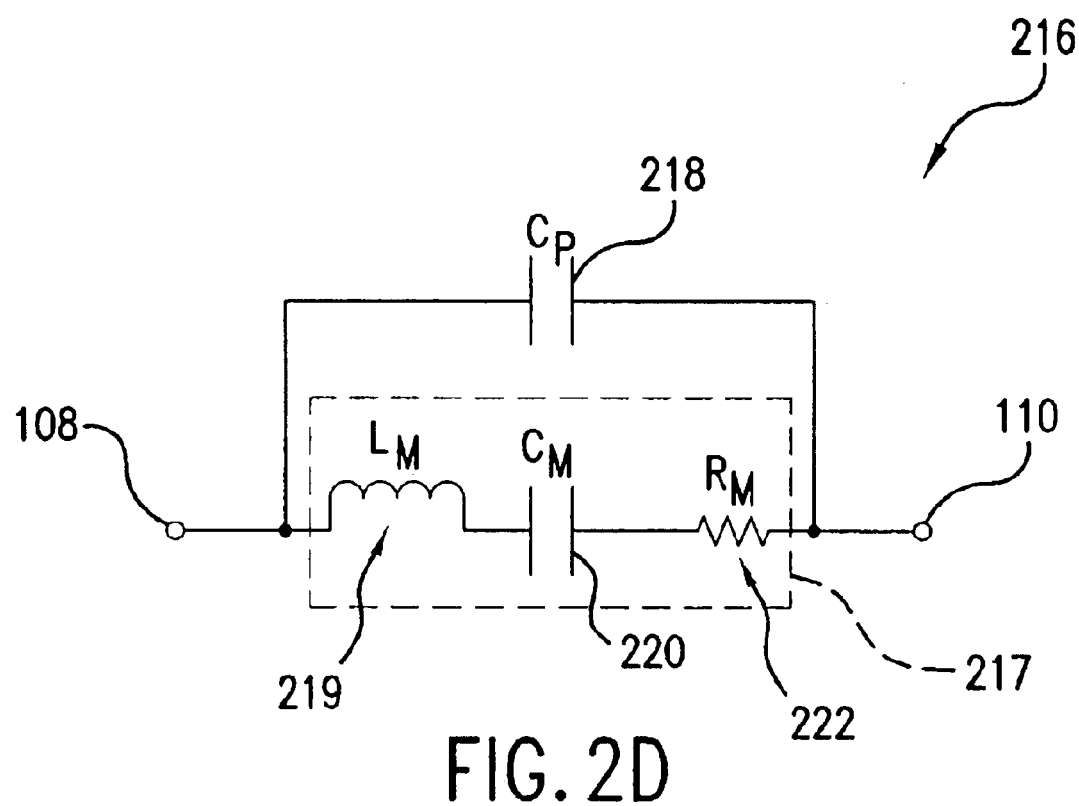
FIG. 2D illustrates an equivalent circuit for a crystal resonator.

The crystal 214 has an equivalent electrical circuit 216 that is shown in FIG. 2D. LC circuit 216 includes a series resonant circuit 217 that represents the equivalent circuit corresponding to the piezoelectric effect for the crystal 214 that was described above. The series resonant circuit 217 includes a motional inductor $L_M$ 219, a motional capacitor $C_M$ 220, and a motional resistor $R_M$ 222. Additionally, the LC circuit 216 has a package capacitance $C_P$ 218 that represents the capacitance associated with the electrical package that the crystal is mounted in.

Figure 3C:
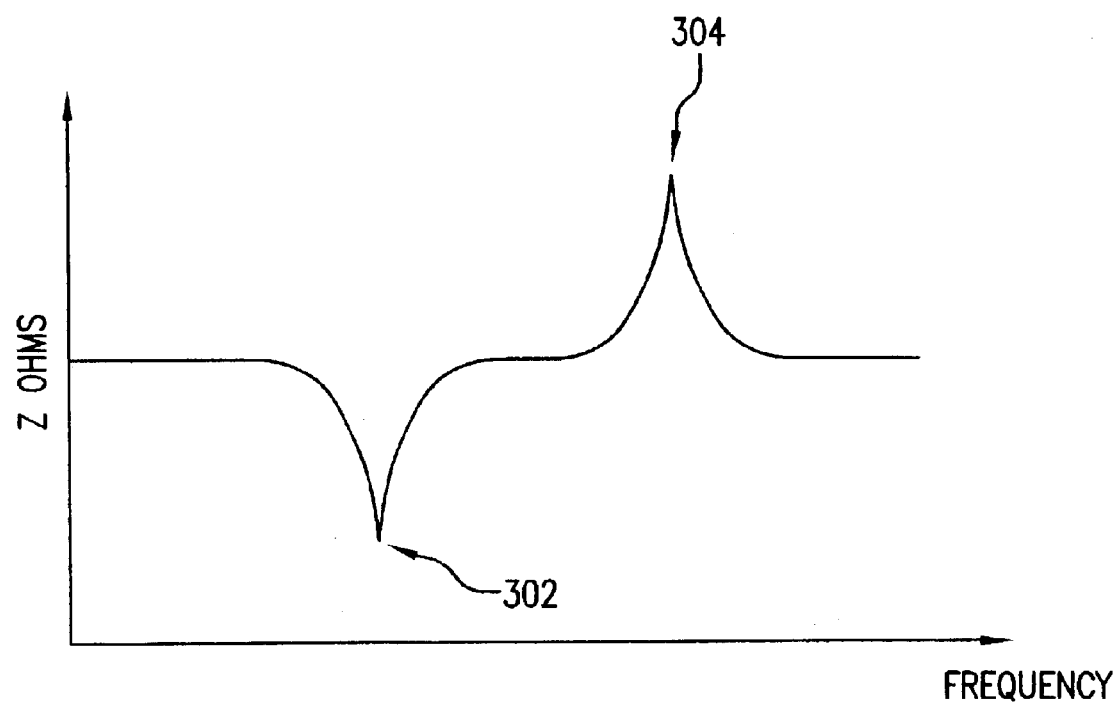
FIG. 3C illustrates an impedance plot for a crystal resonator having a series resonance and a parallel resonance.

The impedance plot for the crystal equivalent circuit 216 is shown in FIG. 3C. As shown in FIG. 3C, the impedance plot includes a first resonance 302 and a second resonance 304. The first resonance 302 is a series resonance that occurs at the frequency where the impedance of the $L_M$ 219 and the $C_M$ 220 cancel each other, and can be calculated by using Eq. 1. The second resonance 304 is a parallel resonance that occurs at the frequency where the admittance of the series resonant circuit 217 and the admittance of the $C_P$ 218 cancel each other, which can be determined by using Eq. 5 herein.

Figure 2E:
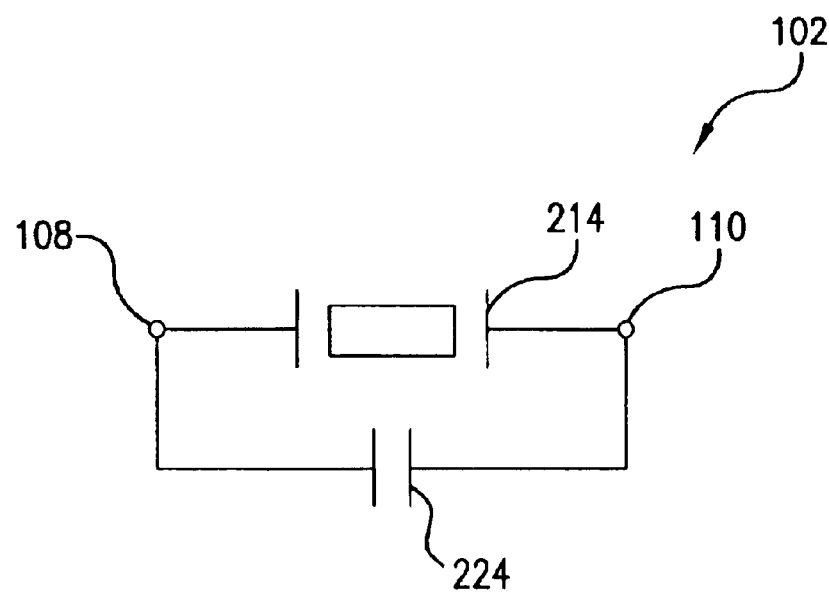
FIG. 2E illustrates a crystal resonator having an additional capacitance in parallel with the crystal resonator.
Figure 2F:
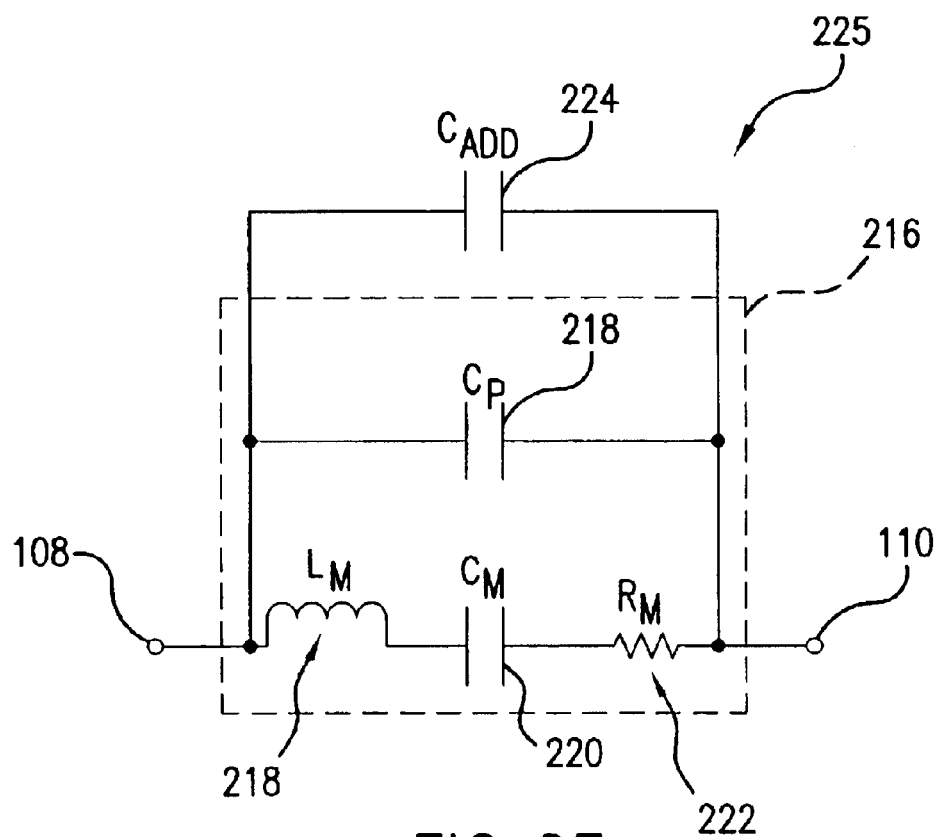
FIG. 2F illustrates an equivalent circuit for the crystal resonator having the additional capacitance.

In radio frequency applications, 10 MHZ is a popular reference frequency. However, standard value commercially available crystals are not resonant at 10 MHZ without adding an additional capacitance 224 in parallel with the crystal 214 as shown in FIG. 2E. FIG. 2F illustrates the equivalent circuit 225 of the crystal resonator 214 with the added capacitance 224. The additional capacitance 224 can be varied to tune the parallel resonance 304 to a desired frequency (e.g. 10 MHZ) by changing the total parallel capacitance of the equivalent circuit 225.

Figure 4:
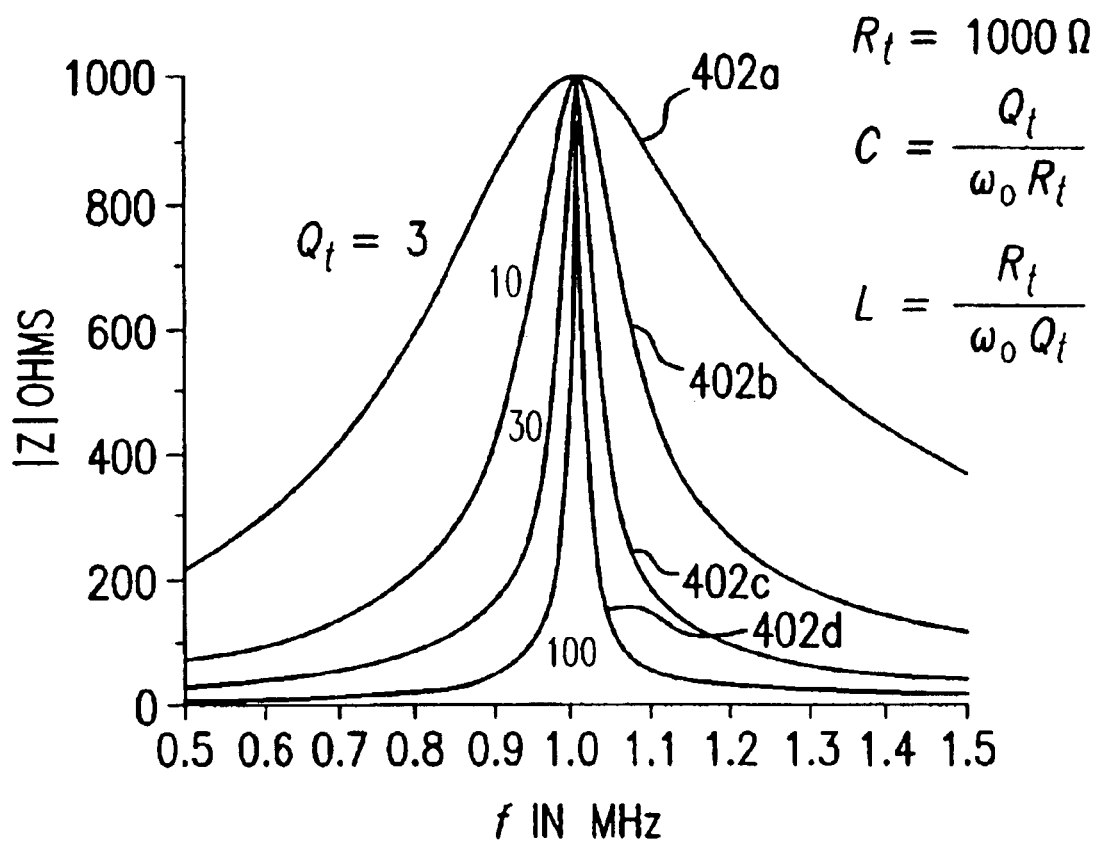
FIG. 4 illustrates various resonant circuit impedance plots for different Q values.

The Q of a crystal is typically substantially higher than resonators that are comprised of discrete circuit elements (i.e. discrete inductors and capacitors). For example, FIG. 4 illustrates several impedance curves 402 for resonant LC circuits having different Q values. Referring to FIG. 4, the curves 402a–c are representative of LC circuits that are made of discrete components, such as LC circuits 201 and 207 described herein. Whereas, the curve 402d is representative of a crystal, such as crystal 214. As shown, the crystal impedance curve 402d has a substantially sharper resonance at the resonant frequency (1.0 MHZ in this example) when compared to the other impedance curves 402a–c. This occurs because the ratio of the motional resistance ($R_M$ 222) to the motional reactance ($L_M$ 219 and $C_M$ 220) of the crystal 214 is much smaller than the ratio of the parasitic resistance to the reactance of the lumped LC circuits 201 and 207.

As mentioned above, the bias resistor 106 represents one or more resistors that bias the active device 104. The active device 104 typically includes one or more transistors and incorporates the bias resistor 106 to provide DC power for the transistors. The bias resistor 106 can be integrated within active device 104 depending on the specific circuit configuration that is utilized, as will be understood by those skilled in the relevant arts. The bias resistor 106 generates thermal noise voltage that increases with increasing temperature, resistance, and circuit bandwidth according to the following equation:

$$V_n^2 = 4kTRB, \text{ where:} \qquad \text{Eq. 4}$$

T=temperature in kelvin
R=resistance
k=Boltzmann's constant
B=bandwidth in hertz.

The thermal noise from the resistor 106 modulates the zero crossing of the output signal 112 of the oscillator 100. Since the output signal 112 is hard limited in the oscillator 100 (because to the oscillator 100 is in saturation), the thermal noise from the resistor 106 leads to higher phase noise in the output signal 112. As shown in FIG. 1C, the phase noise manifests itself as energy "skirts" 114 in the output signal 112 around the resonant frequency $f_0$.

Figure 5:
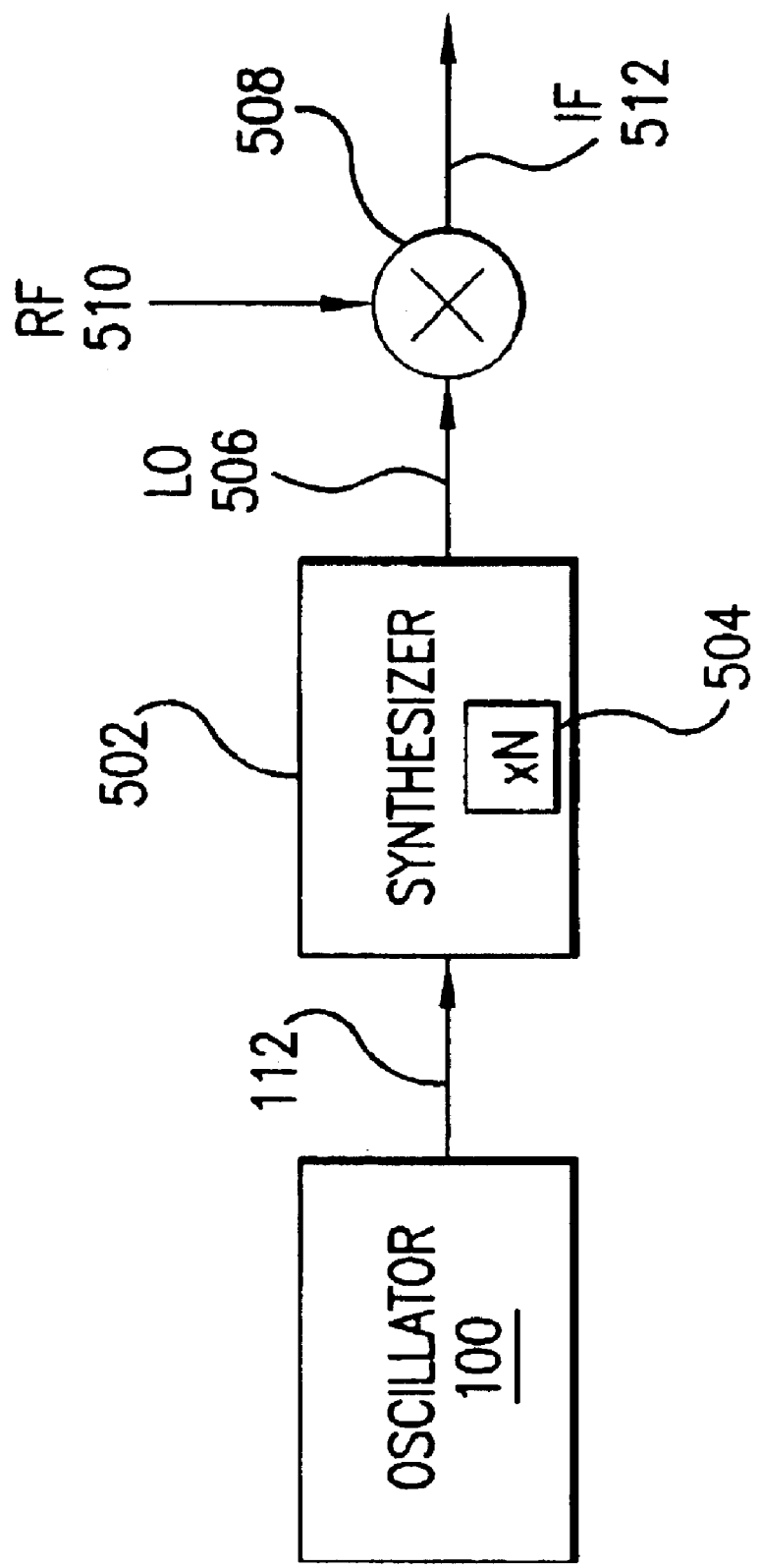
FIG. 5 illustrates a synthesizer that is driven by a oscillator.

Phase noise is undesirable in reference signals that are the basis for frequency multiplication. For instance, FIG. 5 illustrates the oscillator 100 driving a synthesizer 502 to generate a LO signal 506. The synthesizer 502 includes a multiplier 504 that multiplies the frequency of the oscillator output signal 112 by a factor of N, to generate the LO signal 506 that is used for frequency mixing in a mixer 508. Frequency multiplication (which is equivalently phase multiplication) enhances phase noise spectral density as the square of the multiplication factor, so that higher order multiplication of a noisy reference signal should be avoided. More specifically, phase noise density in the LO signal 506 will increase as a factor of $N^2$, where N represents the amount of frequency multiplication. The mixer 508 downconverts a RF signal 510 by frequency mixing the RF signal 510 with the LO signal 506 to generate an IF signal 512.

2. Phase Noise Reduction in Oscillator Circuits

Figure 6:
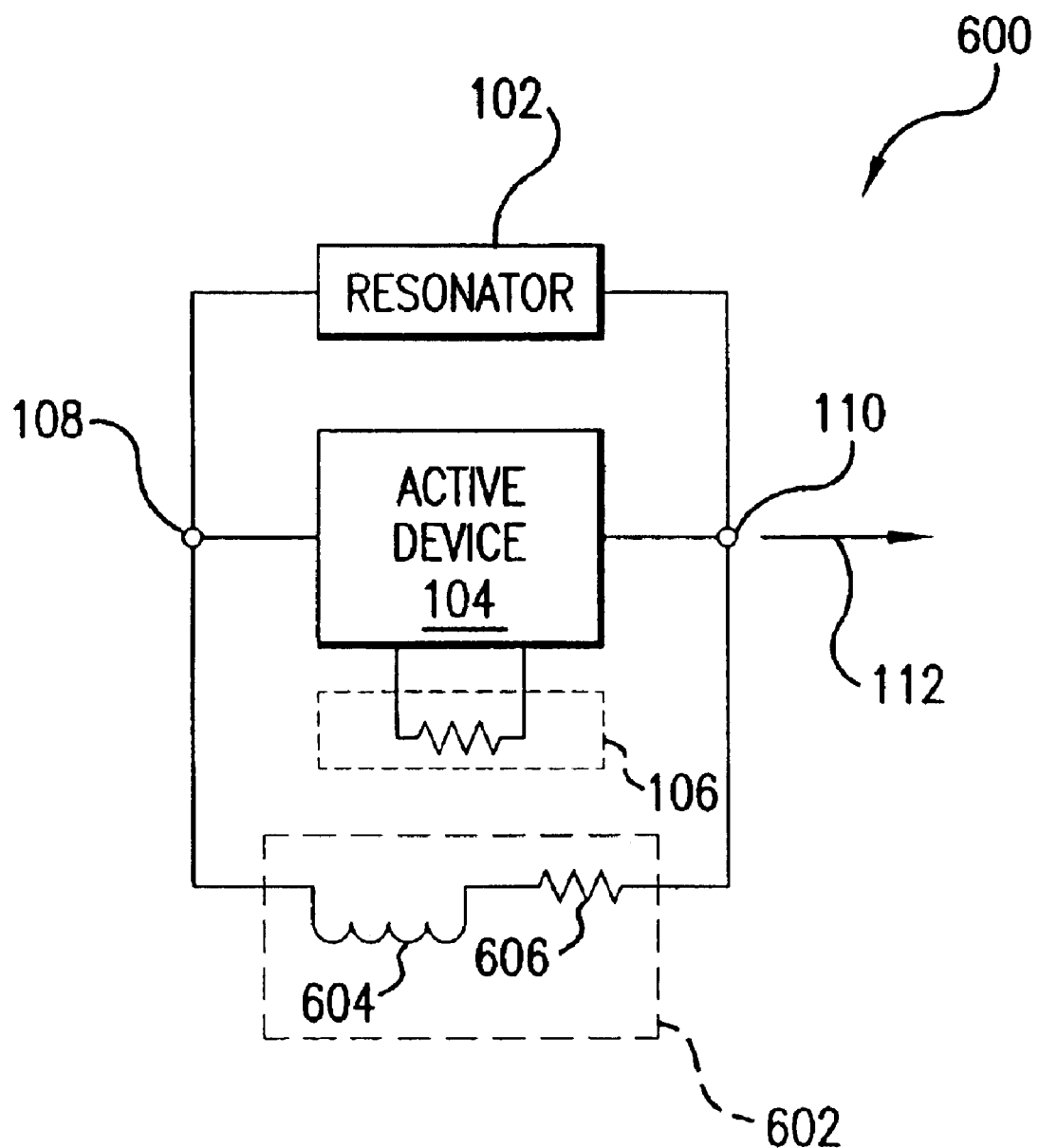
FIG. 6 illustrates an oscillator 600 that has an external inductor circuit to short-out thermal noise that is generated by the oscillator bias resistors according to embodiments of the invention.
Figure 7:
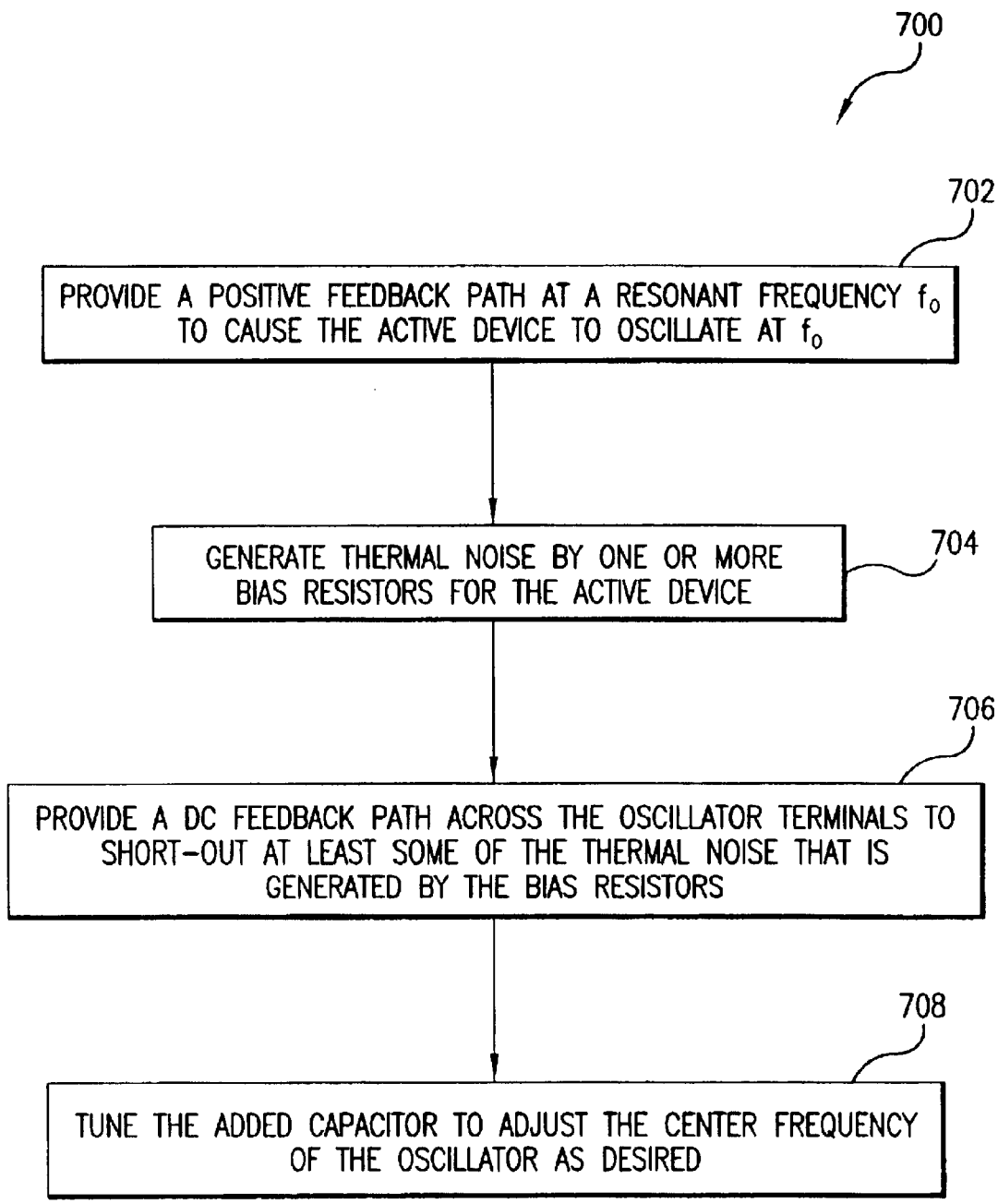
FIG. 7 illustrates a flowchart 700 that further describes the operation of the oscillator 600.

FIG. 6 illustrates an oscillator 600 according to embodiments of the present invention. The oscillator 600 is similar to the oscillator 100 except that the oscillator 600 includes a feedback circuit 602 that is connected across the active device 104. The feedback circuit 602 is connected in parallel with the resonator 102 across the terminals 108 and 110 of the active device 104. The feedback circuit 602 includes inductor 604 and a resistor 606.

The feedback circuit 602 provides a DC path from the terminal 108 to the terminal 110 for any thermal noise that is generated by the bias resistor 106. As such, the thermal noise from the bias resistor 106 is shorted-out and does not increase the phase noise floor of the output signal 112. The feedback circuit 602 is redundant if the resonator 102 is the parallel LC configuration 207 (FIG. 2B) because the inductor 210 already provides a DC path across the terminals 108 and 110. However, the feedback circuit 602 is not redundant if the resonator 102 is the series LC configuration 201 (FIG. 2A) because the capacitor 204 operates as a DC block that prevents DC and low frequency energy from passing through the resonator 201. Additionally, the feedback circuit 602 in not redundant for the crystal 214 because the $C_P$ 218 and the $C_M$ 220 (shown in the equivalent circuit 216) also operate as a DC block that blocks the feedback of DC and low frequency energy.

In addition to nullifying thermal noise, the inductor 604 in the inductor circuit 602 combines with the parallel capacitance in the resonator 102 to cause an (unwanted) low frequency parasitic resonance. For instance, in the crystal 214, the inductor 604 combines with $C_P$ 218 (or the parallel combination of $C_P$ 218 and $C_{ADD}$ 224) to cause an (unwanted) low frequency parasitic resonance. Preferably, the value of the inductor 604 is sufficiently large so this parasitic resonance does not shift the oscillation frequency of the oscillator 600 from the resonant frequency $f_0$ of the resonator 102. The inductor 604 should be selected so as not interfere with the feedback path provided by the resonator 102 at the resonant frequency $f_0$. Accordingly, the parallel combination of the inductor 604 and the resonator 102 should not substantially shift the resonant frequency $f_0$ of the resonator 102, so as not to change the operating frequency of the oscillator 600. This can be accomplished by assuring that the parasitic resonance that is caused by the inductor 604 is lower than the frequency of the desired resonance of the resonator 102 by approximately a factor of $\sqrt{10}$. In other words, the parasitic resonance occurs at a frequency that is approximately $\sqrt{0.1}$ of the frequency of the desired resonance, or lower. For example and without limitation, assuming that the resonator 102 has an intended resonance at 10 MHZ, then the parasitic resonance caused by the inductor 604 should preferably be approximately 3 MHZ, or less. For a given capacitance value, a minimum value for the inductor 604 can be determined from Eq. 1. Assuming that the resonator 102 has an equivalent capacitance of 20 pF, then the value of the inductor 604 should be approximately 100 µH (or greater) in order to assure that the parasitic resonance is at 3 MHZ or below. Note that if the additional capacitance 224 (FIG. 2E) is utilized for tuning the crystal resonance, then the capacitance that is used to calculate the inductor 604 is the parallel combination of $C_{ADD}$ 224 and $C_P$ 218.

The resistor 606 dampens out any unwanted parasitic oscillations that are caused by the addition of the inductor 604. The parasitic oscillations correspond to the parasitic resonance that was described above for the inductor 604. It is preferable to suppress these parasitic oscillations even if the parasitic oscillation frequency is far removed from the intended oscillation frequency because the parasitic oscillations will divert signal power from the intended oscillation frequency, possibly to the extent of completely suppressing the intended oscillation. Additionally, the parasitic oscillations will frequency mix with intended oscillation frequency, and generate spurious signals in the output oscillator signal 112, which reduces overall spectral purity.

The value of the resistor 606 should be sufficiently large to suppress the unwanted oscillations that are associated with the inductor 604. However, the resistor 606 should be no larger than necessary as the resistor 606 generates unwanted thermal noise that increases with the resistance value according to Eq. 4. The thermal noise of the resistor 606 increases the phase noise of the oscillator output signal 112 just like the bias resistor 106, and therefore defeats the purpose of the feedback circuit 602 if the resistor 606 is too large. The exact value of the resistor 606 will depend on the specific application, circuit configuration, and active device gain, as will be understood by those skilled in the relevant arts. In embodiments, the value of the resistor 606 should be less the value of the bias resistor 106. In embodiments, the resistor 606 is a potentiometer (i.e. variable resistor), which allows for a variable amount of resistance to be added to or subtracted from the feedback circuit 602. In alternate embodiments, the resistor 606 is a fixed resistor.

The flowchart 700 further describes the operation of the oscillator circuit 600, and phase noise reduction according to the present invention. The order of the steps in the flowchart 700 is not limiting as some (or all) of the steps can be performed simultaneously or in a different order, as will be understood by those skilled in the relevant arts.

In step 702, the resonator 102 causes the active device 104 to oscillate at the resonant frequency $f_0$ of the resonator 102, generating the output signal 112 that is preferably a pure tone at $f_0$. The resonator 102 provides a positive feedback path for the active device 104 at the resonant frequency $f_0$, thereby causing the active device 104 to oscillate at $f_0$. The resonator 102 can be anyone of the resonators that are shown in FIGS. 2A–2F, or other resonators that will be apparent to those skilled in the relevant arts based on the discussion given herein. In a preferred embodiment, the crystal 224 is the resonator of choice because of its superior Q as described herein.

In step 704, the bias resistor 106 generates thermal noise. The magnitude of the thermal noise voltage increases with temperature, resistance, and circuit bandwidth, according to Eq. 4.

In step 706, the external inductor circuit 602 shorts out at least some of the thermal noise that is generated by the bias resistor 106, and prevents this thermal noise from increasing the phase noise floor of the oscillator output signal 112. More specifically, the inductor 604 and the resistor 606 provide a DC feedback path (and a low frequency feedback path) between the terminals 108 and 110 of the active device 104. The resistor 606 dampens out any parasitic oscillations that are caused by the inductor 604 resonating with the capacitance in the resonator 102.

In step 708, the additional capacitance $C_{ADD}$ 224 can be tuned to adjust the center frequency of the oscillator 600. When the crystal 214 is used as the resonator 102, the capacitance 224 is often added in parallel with the crystal 214 to fine tune the oscillator frequency. If the DC feedback circuit 602 causes the oscillator frequency to shift, then the capacitance 224 can be adjusted to compensate for the frequency shift.

Figure 10:
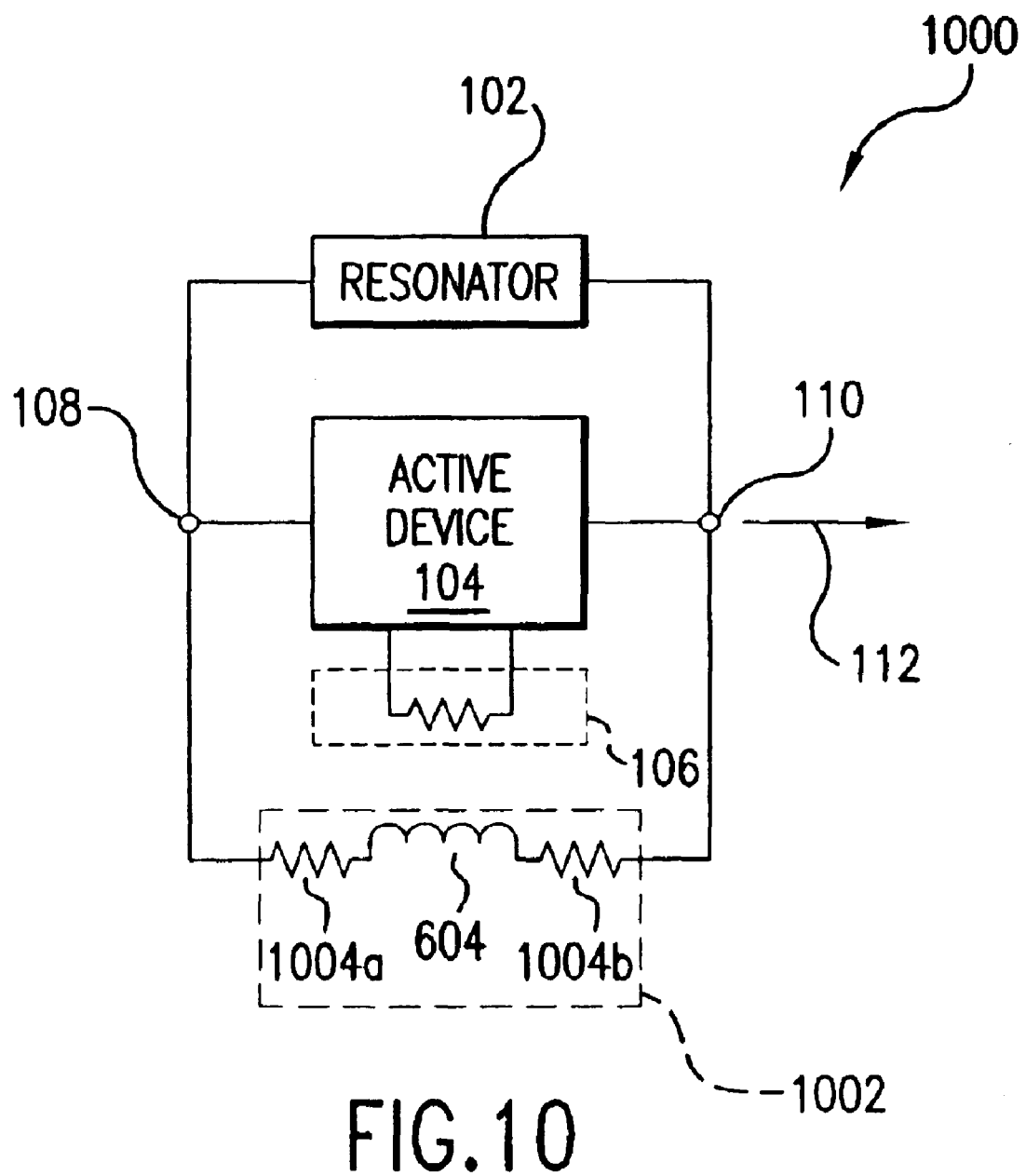
FIG. 10 illustrates an alternate embodiment for the external inductor circuit according to embodiments of the present invention.

FIG. 10 illustrates an oscillator circuit 1000 that has an alternate configuration for the external inductor circuit. More specifically, the oscillator circuit 1000 has an external inductor circuit 1002 with two resistors 1004a and 1004b, in addition to the inductor 604. The resistors 1004 are approximately ½ of the value of the resistor 606 that is shown in FIG. 6.

Figure 8:
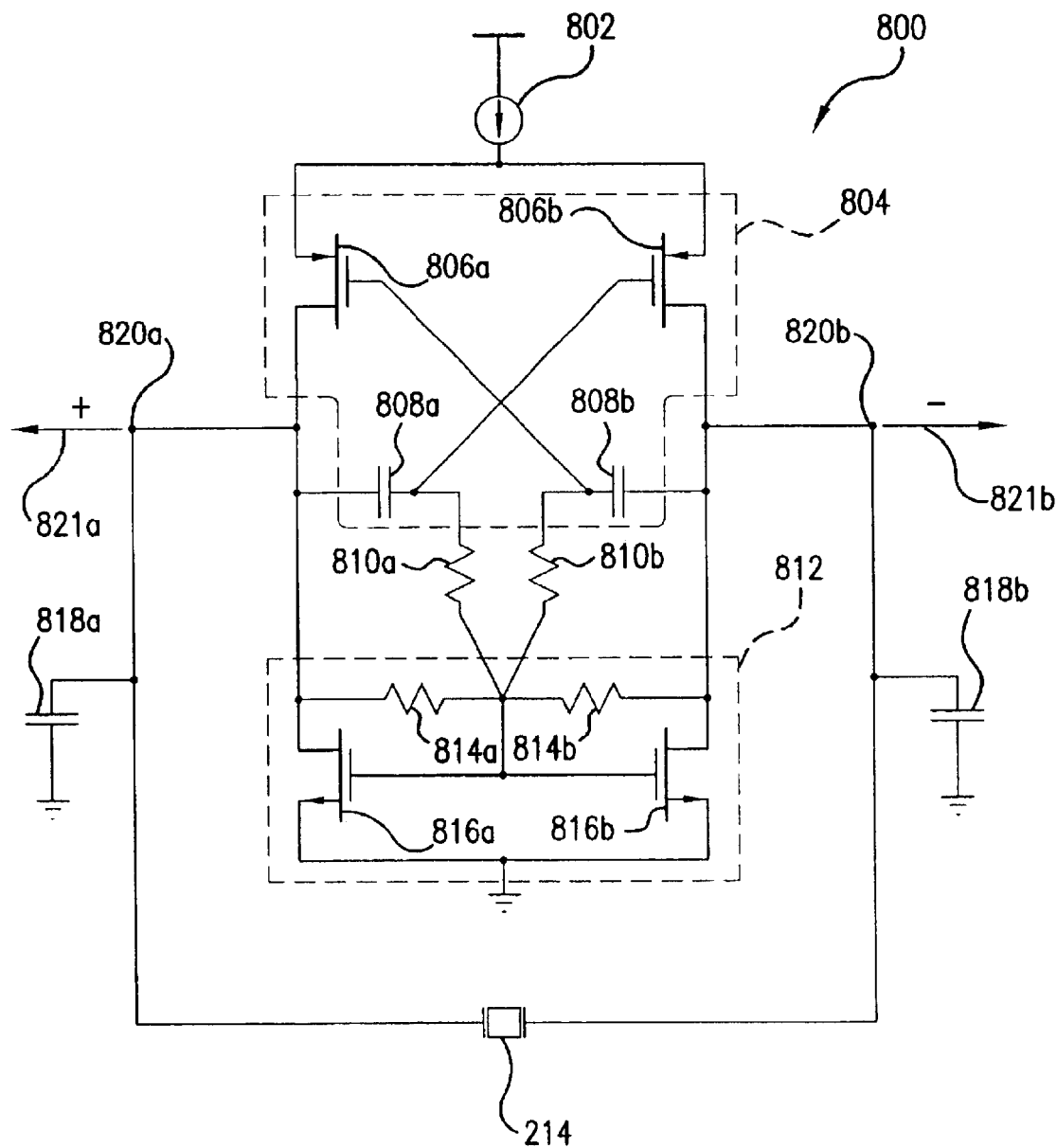
FIG. 8 illustrates a differential crystal oscillator 800 according to embodiments of the present invention.

3. Differential Crystal Oscillator and Phase Noise Reduction:

FIG. 8 illustrates a differential crystal oscillator 800 as one embodiment of the crystal oscillator 100. The differential crystal oscillator 800 is meant for example purposes only and is not meant to limit the invention in any way. Other oscillator configurations could be utilized to practice the invention, as will be understood by those skilled in the relevant arts based on the discussions given herein.

The differential crystal oscillator 800 includes a current source 802, an active device 804, bias resistors 810a and 810b, an active bias circuit 812, and a crystal resonator 214. The active device 804 oscillates at the resonant frequency $f_0$ of the crystal 214, to produce a differential output signal 821 that can be taken across the nodes 820a and 820b. The active bias circuit 812 and the bias resistors 810 provide DC bias for the active device 804. The structure and operation of the differential crystal oscillator 800 is discussed in further detail as follows.

The active device 804 includes cross-coupled transistors 806a and 806b that oscillate at the resonant frequency of the crystal 214. The drain of transistor 806a is coupled to the gate of transistor 806b through a capacitor 808a. Likewise, the drain of transistor 806b is coupled to the gate of the transistor 806a through a capacitor 808b. This cross coupled arrangement provides a feedback path for AC signals that pass through the capacitors 808. The crystal 214 is coupled across the nodes 820a and 820b, which are also the drains of the respective transistors 806a and 806b. As such, the crystal 214 is coupled in parallel with feedback path for the cross coupled transistors 806a and 806b. At resonance, the impedance of the crystal 214 becomes an open circuit, and causes a positive feedback condition to exist between the transistors 806 at the resonant frequency $f_0$ of the crystal 214. The positive feedback causes the transistors 806 to oscillate at the resonant frequency $f_0$ of the crystal 214, and produce the differential output signal 821 that can be taken across the nodes 820a and 820b. The capacitors 818a and 818b are used to tune to the output frequency of the crystal oscillator 800, and therefore function as the capacitor $C_{ADD}$ 224 in FIG. 2F.

The transistors 806 are not directly coupled to each other because doing so would cause the transistors to latch-up. In other words, one transistor 806 would turn-on all the way and the other transistor 806 would be cutoff, preventing the desired oscillation. The capacitors 808 prevent the lock-up condition by blocking DC feedback between the respective gates and drains of the transistors 806.

The active bias circuit 812 includes two diode connected transistors 816a and 816b. The resistor 814a connects the drain and gate of the transistor 816a to form the diode connection for the transistor 816a. The resistor 814b connects the drain and gate of the transistor 816b to form the diode connection for transistor 816b. The diode connected transistors 816a and 816b provide a stable common mode drain voltage at nodes 820a and 820b, based on the current source 802.

The bias resistors 810a and 810b are also connected to the nodes 820a and 820b (through the resistors 814) and provide gate bias voltage for the transistors 806. More specifically, the resistor 810a provides DC bias for the gate of the transistor 806b, and the resistor 810b provides DC bias for the gate of the transistor 806a.

As shown, the bias resistors 810 are also connected to the feedback capacitors 808, and shunt away some of the feedback signal that is meant for the transistors 806, thereby reducing the overall gain of the transistors 806. If the gain is reduced too much, then the positive feedback will be quashed, and the transistors 806 will not oscillate as intended. Therefore, the resistors 810 should be relatively large to maintain the gain of the active circuit 804. In embodiments, the value of the resistors 810 are in the 10k ohm range, but other resistor values could be utilized as will be understood by those skilled in the relevant arts. The bias resistors 810 generate thermal noise voltage that increases with their resistance value according to the Eq. 4. As discussed herein, this thermal noise voltage is undesirable because it increases the phase noise floor of the oscillator output signal.

The differential crystal oscillator 800 is further described in U.S. patent application entitled, "Differential Crystal Oscillator", Ser No. 09/438,689, filed on Nov. 12, 1999, which is incorporated herein by reference in its entirety.

Figure 9:
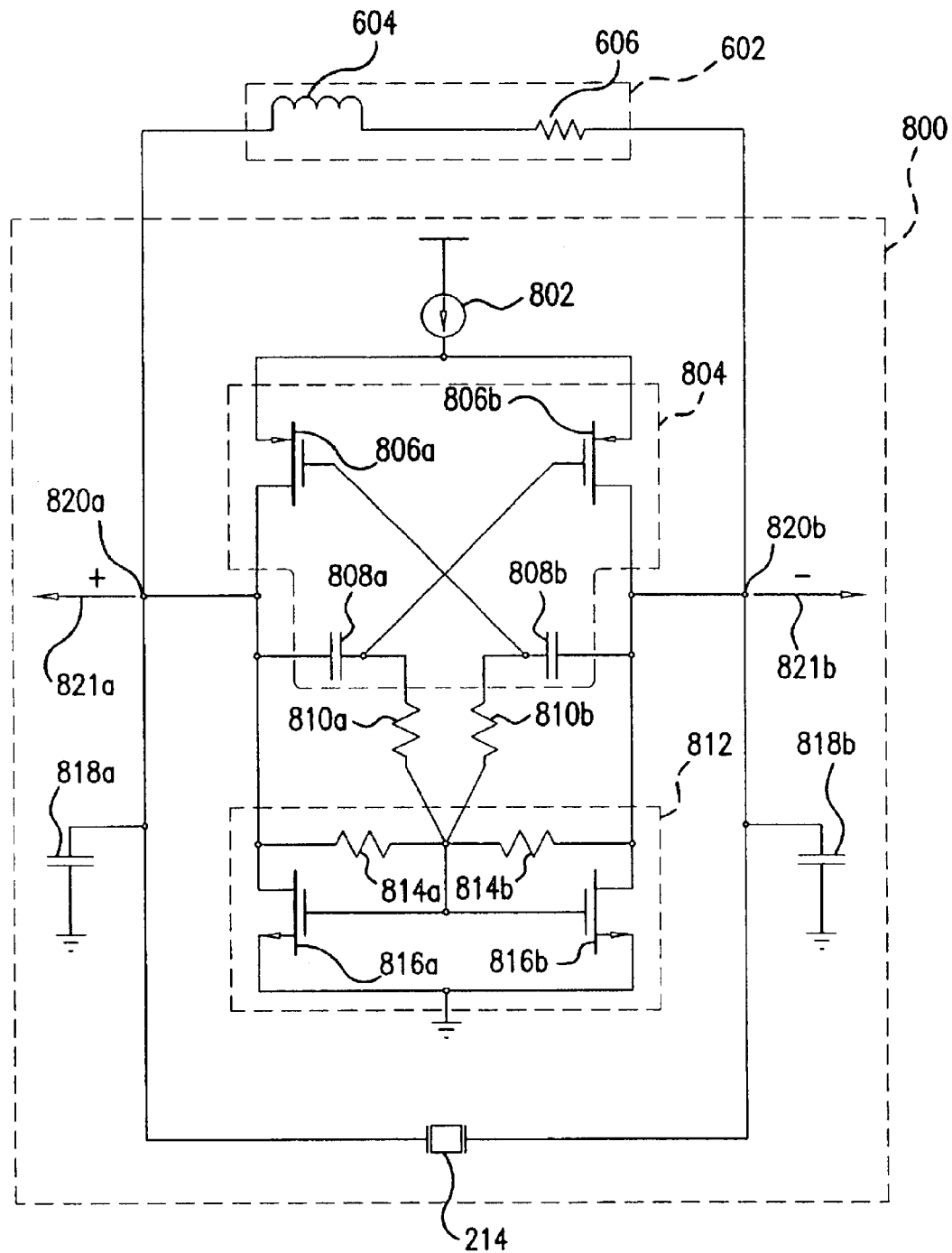
FIG. 9 illustrates the differential crystal oscillator 800 with an external inductor circuit to short-out thermal noise that is generated by the oscillator bias resistors according to embodiments of the present invention.

FIG. 9 illustrates the oscillator 800 with the inductor circuit 602 connected across the output nodes 820a and 820b of the oscillator 800. The inductor circuit 602 is also in parallel with the crystal 214. The inductor circuit 602 provides a DC feedback path across the output nodes 820a and 820b for any thermal noise from the bias resistors 810 and the feedback resistors 814. As such, the thermal noise from the bias resistors 810 and the feedback resistors 814 is shorted-out and does increase the phase noise of the oscillator output signal 821.

As stated above, the inductor circuit 602 is in parallel with the crystal 214. Therefore, the inductor 604 can resonate with the equivalent capacitance of the crystal 214 to cause an (unwanted) parasitic resonance. For instance, the inductor 604 could resonate with the package capacitance 218 (FIG. 2D) or the combination of the package capacitance 218 and the added capacitance 224 (FIGS. 2E–F). Preferably, the value of the inductor 604 is sufficiently large so this parasitic resonance does not shift the oscillation frequency of the oscillator 800 from the resonant frequency $f_0$ of the crystal 214. Accordingly, the parallel combination of the inductor 604 and the crystal 214 should not substantially shift the resonant frequency $f_0$ of the crystal 214, so as not to change the operating frequency of the oscillator 800. This can be accomplished by assuring that the parasitic resonance caused by the inductor 604 is lower than the intended resonant frequency of the crystal 214 by at least approximately a factor of $\sqrt{0.1}$. For example and without limitation, if the crystal 214 is resonant at 10 MHZ, then the parasitic resonance caused by the inductor 604 should preferably be approximately 3 MHZ, or less. For a given capacitance value, a minimum value for the inductor 604 can be determined from Eq. 1. For example, if the crystal 214 has an equivalent capacitance of 20 pF, then the value of the inductor 604 should preferably be approximately 100 $\mu$H (or greater) in order to assure that this parasitic resonance is at 3 MHZ or below. Note that if the added capacitance 224 (FIGS. 2E–F) is utilized for tuning the crystal resonance, then the total capacitance that is used for in the determination of the inductor 604 is the parallel combination of the capacitor 224 and the capacitor 218.

The resistor 606 dampens out any unwanted parasitic oscillations that are caused by the addition of the inductor 604. The parasitic oscillations correspond to the parasitic resonance that was described above for the inductor 604. It is important to suppress these unwanted oscillations even if the parasitic oscillation frequency is far removed from the intended oscillation frequency because the parasitic oscillations will divert signal power from the intended oscillation frequency. Additionally, parasitic oscillations will frequency mix with intended oscillation frequency and generate spurious signals in the output oscillator signal 821, which reduces overall spectral purity of the oscillator signal 821.

The value of the resistor 606 should be sufficiently large to suppress the unwanted oscillation modes caused by the inductor 602. However, the resistor 606 should be no larger than necessary as the resistor 606 generates unwanted thermal noise that increases with the resistance value according to Eq. 4. The thermal noise of the resistor 606 increases the phase noise of the oscillator output signal 821 just like the bias resistors 810, and therefore defeats the purpose of the inductor circuit 602 if the resistor 606 is too large. As such, the resistor 606 should be no larger than the bias resistors 810, which are approximately 10 k ohms for some applications. In embodiments, the resistor 606 is a potentiometer (i.e. variable resistor), which allows for a variable amount of resistance to be efficiently added to or subtracted from the inductor circuit 602.

4. External Inductor Determination

As stated above, in embodiments of the invention, the inductor 604 is selected so that the parasitic resonance that is caused by the inductor 604 is approximately $\sqrt{0.1}$ of the frequency of the desired resonance of the crystal 214. The following discussion and equations provide mathematical support for this determination.

Referring to FIG. 2F, the parallel resonance for the crystal 214 occurs at the frequency where the admittance of the series resonant circuit 217 cancels the admittance of ($C_P$218$\|C_{ADD}$224). Assuming in the equations below that $C_P=(C_P$218$\|C_{ADD}$224), then the parallel resonance is determined by the equation 5 below:

$$\omega_p = \sqrt{\omega_s^2 + \frac{1}{C_P L_M}} \quad \text{where} \qquad \text{Eq. 5}$$

$$\omega_s = \frac{1}{\sqrt{L_M C_M}} \qquad \text{Eq. 6}$$

When the external inductor circuit 602 is included as in FIG. 6, and ignoring the series resistor 606, then it can be shown that the parallel resonance becomes:

$$\omega_p \approx \omega_s + \frac{1}{2} \frac{C_M}{C_P\left(1 - \frac{\omega_{parasitic}^2}{\omega_p^2}\right)} \qquad \text{Eq. 7}$$

where $\Omega_{parasitic}$ represents the (unwanted) low frequency resonance that is caused by the external inductor 604 resonating with $C_P$. Based on Eq. 7 it is desirable that:

$$\frac{\omega_{parasitic}^2}{\omega_p^2} \leq 0.1 \qquad \text{Eq. 8}$$

According to Equation 8, it is preferable that the frequency of the parasitic resonance is approximately $\sqrt{0.1}$ of the frequency of the desired resonance, or lower. Stated another way, the parasitic resonance is preferably lower than the frequency of the desired resonance by at least approximately a factor of √10. The result is that the effect of the external inductor 604 on the parallel resonance of the crystal 214 will be less than the tolerance of the additional capacitor 224, which is typically 5–10% of the capacitor 224 value.

5. Other Applications

The noise reduction invention described herein has been discussed in reference to a crystal oscillator. However, the noise reduction invention is not limited to crystal oscillators. The noise reduction invention is applicable to other oscillator circuit configurations, including oscillator circuits that use other types of resonators, such as discrete circuit elements. Additionally, the noise reduction invention is applicable to other (non-oscillator) active circuits that can benefit from a low frequency feedback path that shorts-out thermal noise. The application of this noise reduction invention to these other active circuits will be understood by those skilled in the relevant arts based on the discussions given herein, and are within the scope and spirit of the present invention.

6. Conclusion

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. A method, comprising:

biasing an active circuit using at least one resistor; and reducing thermal noise generated by the at least one resistor using feedback coupled in parallel with the active circuit.

2. The method of claim 1, wherein biasing the active circuit includes biasing the active circuit having an active element coupled in parallel with a resonator.

3. The method of claim 1, further including causing the active element to oscillate at a resonant frequency to produce a periodic signal.

4. The method of claim 3, further including tuning the resonant frequency to compensate for a frequency shift associated with the feedback.

5. The method of claim 4, wherein tuning the resonant frequency includes adjusting a capacitance coupled to the active circuit.

6. The method of claim 1, wherein reducing the thermal noise includes reducing the thermal noise generated by the at least one resistor using direct current (DC) feedback coupled in parallel with the active circuit.

7. The method of claim 6, wherein biasing the active circuit includes biasing the active circuit having a first terminal and a second terminal, and reducing the thermal noise includes shorting the thermal noise across the first terminal and the second terminal.

8. An apparatus, comprising:

means for biasing an active circuit; and means for reducing thermal noise generated by the means for biasing, the means for reducing thermal noise coupled in parallel with the active circuit.

9. The apparatus of claim 8, wherein the active circuit is to provide a periodic signal based on a resonant frequency of a resonator.

10. The apparatus of claim 9, wherein the active circuit is coupled in parallel with the resonator.

11. The apparatus of claim 10, wherein the active circuit includes a first transistor cross-connected with a second transistor, the first and second transistors to oscillate at the resonant frequency.

12. The apparatus of claim 11, wherein a gate of the first transistor is connected to a drain of the second transistor, a gate of the second transistor is connected to a drain of the first transistor, and the drains of the first and second transistors form a differential output.

13. The apparatus of claim 12, wherein the gate of the first transistor is connected to the drain of the second transistor through a first capacitor and the gate of the second transistor is connected to the drain of the first transistor through a second capacitor.

14. The apparatus of claim 9, wherein the means for reducing thermal noise includes an inductor and a resistor connected in series.

15. The apparatus of claim 14, wherein the inductor is large enough that a parasitic resonance caused by the inductor is lower in frequency than the resonant frequency of the resonator by at least a factor of the square root of 0.1.

16. The apparatus of claim 15, wherein the resistor is large enough to prevent the active circuit from oscillating at the parasitic resonance.

17. The apparatus of claim 9, wherein the resonator is a crystal resonator.

18. The apparatus of claim 9, further including a first output terminal and a second output terminal, and a first capacitor is coupled to the first terminal and a second capacitor is coupled to the second terminal, the first and second capacitors capable of compensating for a frequency shift associated with the means for reducing thermal noise.

19. The apparatus of claim 8, wherein the active circuit includes a differential output to oscillate at the resonant frequency.

20. The apparatus of claim 8, wherein the active circuit includes a first terminal and a second terminal, and the means for reducing thermal noise shorts the thermal noise across the first terminal and the second terminal.

21. The apparatus of claim 8, wherein the means for biasing includes a plurality of transistors and a plurality of resistors.

* * * * *